(12) United States Patent
Kazem

(10) Patent No.: US 6,912,133 B2
(45) Date of Patent: Jun. 28, 2005

(54) RUGGEDIZED INVERTER CHASSIS

(75) Inventor: Kamran Kazem, Irvine, CA (US)

(73) Assignee: Magnetic Design Labs Inc., Santa Ana, CA (US)

( * ) Notice: Subject to any disclaimer, the term of this patent is extended or adjusted under 35 U.S.C. 154(b) by 85 days.

(21) Appl. No.: 10/624,376

(22) Filed: Jul. 21, 2003

(65) Prior Publication Data

US 2004/0037056 A1 Feb. 26, 2004

Related U.S. Application Data

(60) Provisional application No. 60/397,881, filed on Jul. 22, 2002.

(51) Int. Cl.[7] ............................. H05K 5/00; H05K 5/04; H05K 5/06; H05K 7/02; H05K 7/04
(52) U.S. Cl. ....................................... 361/752; 361/807
(58) Field of Search ................................. 361/601, 603, 361/622, 623, 748, 752, 807; 363/31, 55, 144, 146

(56) References Cited

U.S. PATENT DOCUMENTS

5,091,823 A * 2/1992 Kanbara et al. ............ 361/697

* cited by examiner

*Primary Examiner*—Phuong T. Vu
(74) *Attorney, Agent, or Firm*—James F. Kirk

(57) ABSTRACT

A ruggedized inverter structure or chassis has an integral frame with a right, rear and left vertical wall formed in the shape of a channel or U from a single plate of aluminum. A rectangular base also formed from a single plate has a front, right, rear and left side bordering a rectangular base plate. A front, right, rear and left vertical wall is formed on the rectangular base plate, each with a single bend. The front and rear walls are bent to form front and a rear mounting flanges. The base plate right and left vertical walls are coupled to the inner surface of the corresponding integral frame right and left vertical walls. A base plate rear wall is coupled to the integral frame rear wall. A transformer mounting plate is coupled to the front and rear mounting flanges. Right and left power modules are mounted.

17 Claims, 10 Drawing Sheets

RUGGEDIZED INVERTER CHASSIS

This application claims priority from U.S. Provisional 60/397,881 filed Jul. 22, 2002, having a common inventor.

FIELD OF THE INVENTION

This invention relates to the field of power supplies and more particularly to the field of high output power dc to ac converters or inverters such as those rated for a continuous output power of 2500 Watts at a frequency of 60 Hz and yet even more particularly to the structure required to package one or more heavy components such as a large silicon steel core toroidal power transformer in a unit intended for use in a military vehicle such as a military tracked vehicle required to reliably operate while being subjected to high levels of shock and vibration and with reduced weight.

BACKGROUND OF THE INVENTION

An inverter chassis is typical formed as a base plate or frame on which components are mounted. Brackets are coupled to the base plate and the components are then bolted to the brackets. The chassis typically used to house a 2500 Watt inverter for use in a tracked vehicle such a personnel carrier tracked mobile artillery vehicle or a tank are required to withstand very high levels of shock and vibration. To control or to eliminate warping and flexing in vibration tests with limits as high as 100 Gs, conventional designs stiffen the structure by increasing the thickness of the base and frame materials and also the plating from which internal mounting brackets are formed. As the weight of the major power components such as the output transformer and associated power switching function modules increases, and as their form factor changes and grows, the size and corresponding weight of the resulting chassis is driven to a higher limit. Inverters purchased by the military for use in mobile vehicles compete within categories that have having a given input voltage and a given output voltage and power range largely on the basis of size, weight and cost with reliability being held as a very high priority consideration.

In the past, conventional units have used a large silicon steel E-Core design for the output transformer. An E-core transformer is typically formed and mounted using holes at the four corners of the core laminations. Bolts are passed through the corner holes from a mounting bracket to secure the transformer. Clearance must be provided for wire on the center leg bobbin or on each of two end leg bobbins. The bobbins themselves must be secured by bonding to a core leg or legs. The form factor of an E-Core transformer is less efficient volumetrically than the form factor of a toroidal transformer because the bobbin or bobbins are eliminated. Some toroidal cores use a non magnetic core covering or can to contain the tape material. Larger cores are bonded and then wrapped. One disadvantage of a steel tape wound toroid core is that there are no convenient bolt for mounting as discussed in connection with the holes at the corners an E-core. The absence of a convenient, mounting arrangement may partially be the reason for the absence of use of toroidal transformers in high wattage output 60 Hertz inverters. Winding a steel tape wound toroid core is more complex than winding a bobbin for an E-core. Toroid cores require a special machine and the use of a shuttle which is preloaded with the wire to be placed on the core. However, once the wire lengths are determined, the assembly can be largely automated.

SUMMARY OF THE INVENTION

The above-noted problems associated with mounting a steel tape wound toroid core transformer and the other problem of minimizing the weight of a unit required to survive vibration stress levels up to 100 G's are overcome in accordance with the embodiments of the invention by the ruggedized inverter chassis disclosed in FIGS. 1 through 10a–10e in this application.

In a first preferred embodiment of the ruggedized inverter structure, an integral and homogenous frame has a right vertical wall, an integral frame rear vertical wall and an integral frame left vertical wall formed from a single sheet of 0.25 inch thick aluminum. Each vertical wall of the integral frame has an inner surface and an outer surface. Only two bends are required and all required holes are punched or drilled.

A rectangular base is also formed from a single sheet or plate of aluminum. A front mounting flange and a rear mounting flange are formed from the sheet by bending extended regions of the sheet twice at each end of the extended regions to form a front and rear mounting flange the base is also homogenous and integral since it is formed from a single sheet. A right and left vertical wall is formed on each side of the plate with a single bend.

Each vertical wall formed from the rectangular base plate has an inner surface and an outer surface. The rectangular base plate is positioned between the inner surface of the integral frame right vertical wall, and the inner surface of the integral frame left vertical wall. The rectangular base plate is orientated and dimensioned to position and couple the rectangular base right vertical wall outer surface, integral frame rear vertical wall outer surface and integral frame left vertical wall outer surface against and in surface contact with the corresponding and opposed inner surfaces of the integral frame right vertical wall, integral frame rear vertical wall and integral frame left vertical wall. The walls are then coupled using screws, bolts, rivets or structural adhesive.

A transformer assembly has a transformer coupled to a 0.25 inch thick rectangular transformer mounting plate. The transformer mounting plate has a front end and a rear end each of which is coupled to a corresponding front mounting flange and a rear mounting flange.

In yet a more particular embodiment, the transformer is made using a toroidal core. The central region of the transformer is filled with a resin that is loaded with a thermally conductive material and a hole is formed in the center of the transformer to permit a bolt to pass through the transformer and the mounting plate to couple the transformer to the mounting plate.

In yet a more particular embodiment of the ruggedized inverter structure or chassis, a right power module is coupled to the homogenous integral frame right vertical wall, and a left power module is coupled to the homogenous integral frame left vertical wall. The right and left power modules each have a base plate that is a large 0.25 inch thick aluminum plate that is attached to the corresponding vertical wall. In addition to providing a heat sink for the multiple rows of semiconductor switches on each power module, the base plates add stiffness to the corresponding integral and homogenous frame vertical wall.

The right power module comprises a compression bar typically formed from ¼ inch aluminum bar stock that is at least as wide as the length of the metal tab on the semiconductor switches that are used on the module, a circuit board insulator layer of insulation to electrically isolate the compression bar, a circuit board to which leads from the semiconductor switches are connected through feed through holes, and a rubber compression bar. The plastic top surfaces of a row of semiconductor switches, typically in TO-220 packages are aligned to form a plane. Each semiconductor switch has a metal tab opposite the plastic case. A switch tab insulator layer is used to isolate each semiconductor switch tab from electrical contact with the inner surface of the ¼ inch thick base plate. The switch tab insulator layer is a strip of material that extends under the tabs of a plurality of semiconductor switch tabs.

BRIEF DESCRIPTION OF THE DRAWINGS

Details of the invention, and preferred embodiments thereof, will be further understood upon reference to the drawing, wherein:

FIG. 4b is a schematic sectional view of the toroidal core and mounting plate assembly taken on section line 4a—4a;

DETAILED DESCRIPTION OF PREFERRED EMBODIMENTS

FIGS. 1–10, schematically depict the features of a preferred embodiment of the ruggedized inverter structure 10 that was used with a dc-to-ac inverter having a rated output of 2500 Watts at 120 Vac at a frequency of 60 Hz from a battery stack (not shown) providing a 21 to 30 Vdc input. The example dc-to-ac inverter was required to support short term output loads of ten times its rated output for periods in excess of seven seconds. The dc-to-ac inverter had a total weight of approximately 56 pounds. The transformer assembly had a weight of 38 pounds. The unit was successfully tested at vibration levels that subjected the unit under test to acceleration stress levels of up to 100 Gs.

Figure 1:
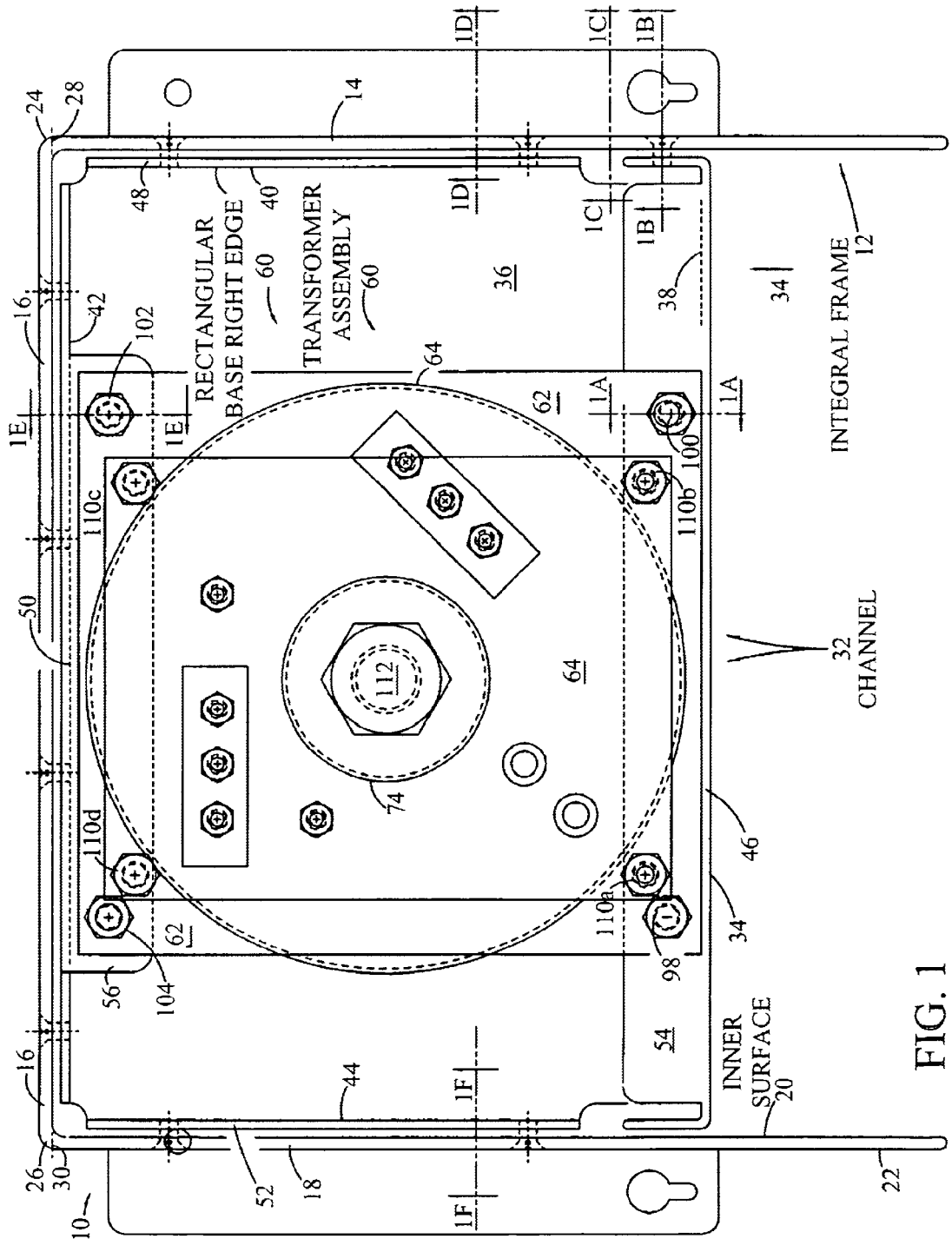
FIG. 1 is a schematic top view of the inverter assembly showing the integral frame with the toroidal core and mounting plates assembly on the rectangular base.
Figure 2:
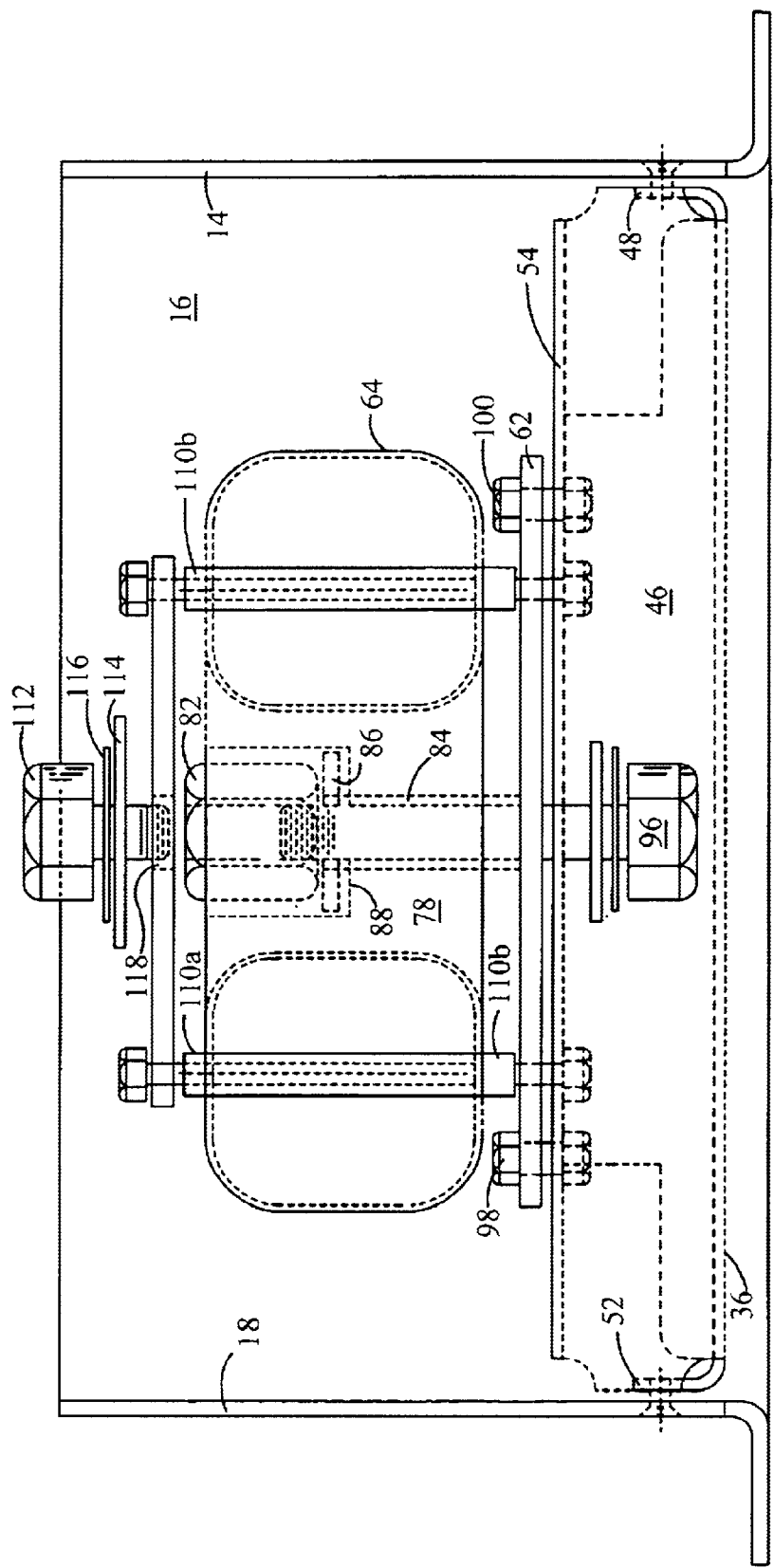
FIG. 2 is a schematic front view of the inverter assembly showing the integral frame with the toroidal core and mounting plates assembly on the rectangular base.
Figure 5:
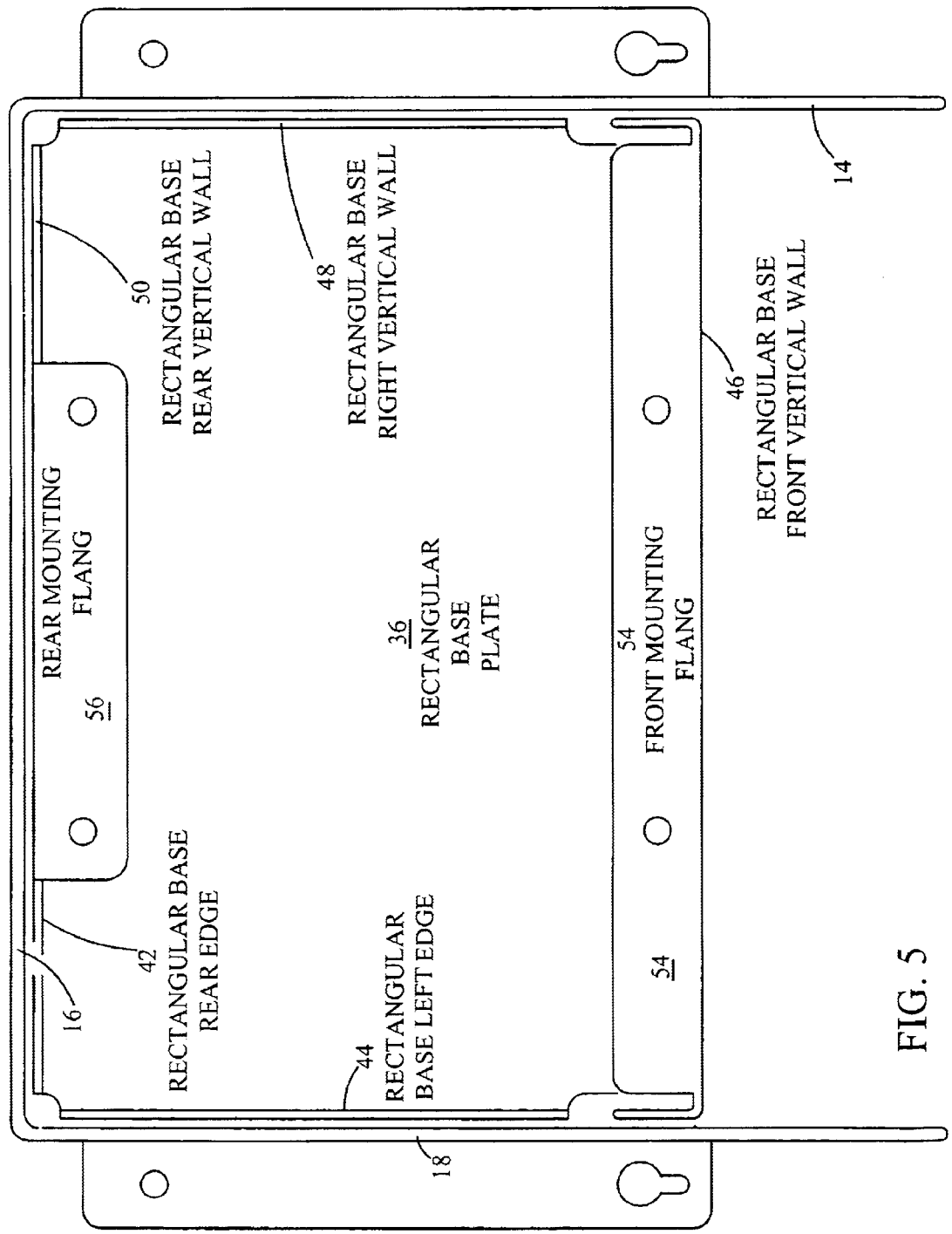
FIG. 5 is a top view of the inverter integral frame with the rectangular base inserted therein.
Figure 7:
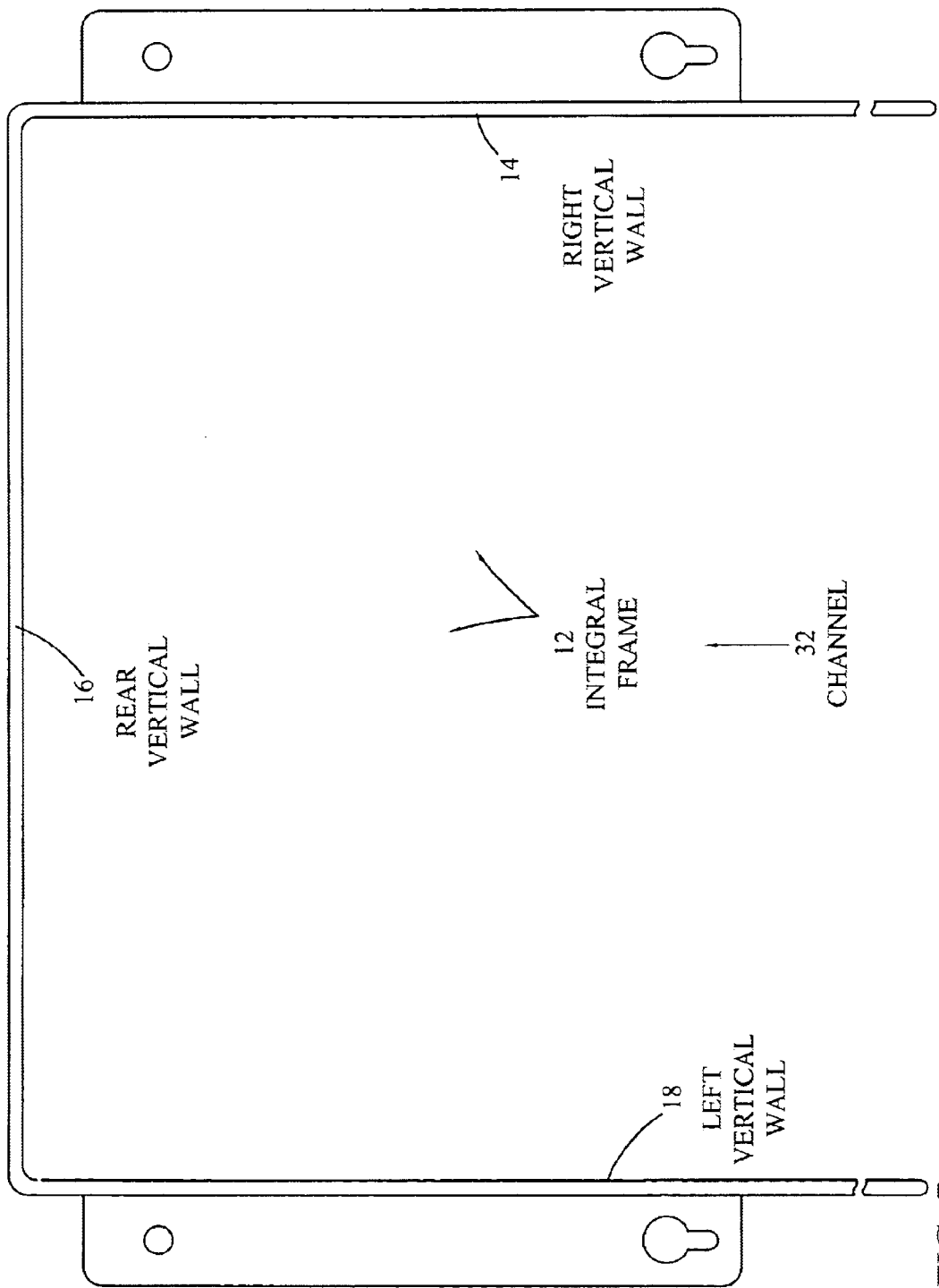
FIG. 7 is a top view of the integral frame.

FIGS. 1, 2, 5 and particularly FIG. 7, show the ruggedized inverter structure 0.10 having a U or channel shaped integral frame 12. FIG. 7 shows the integral frame right vertical wall, 14 an integral frame rear vertical wall 16 and an integral frame left vertical wall 18 formed from a flat homogenous aluminum plate having a thickness of 0.187 inches. The integral frame right vertical wall and the integral frame left vertical wall, in the example of a ruggedized 2500 Watt dc-to-ac inverter, are spaced apart in parallel relation and separated by at distance of approximately 18 inches.

FIG. 7 provides a top view of the integral frame as a stand-alone component having an integral frame right vertical wall 14, an integral frame rear vertical wall 16 and an integral frame left vertical wall 18. Each respective integral frame vertical wall has a respective inner surface 20 and outer surface 22. The integral frame 10 as shown in FIG. 7 has an integral frame rear vertical wall 16 with an integral frame rear vertical wall right end 24 and a left end of the integral frame rear vertical wall 26. The integral frame rear vertical wall right end 24 is shown coupled to the distal end of the integral frame right vertical wall 28. The left end of the integral frame rear vertical wall 26 is coupled to the distal end of the integral frame left vertical wall 30. As shown in FIG. 7, the coupled walls form a channel 32 between the integral frame right and integral frame left vertical wall that has an end or is terminated by the presence of the integral frame rear vertical wall 16.

In a preferred embodiment, the integral frame is both integral and homogenous in that it is formed from a single plate of aluminum having no joints, seams or welds. In an alternative embodiment, the integral frame left vertical wall, the integral frame right vertical wall and the integral frame rear vertical wall could be formed as separate parts and welded, or bent to have complementary corner flanges (not shown) which when joined could be coupled by riveting, screws or structural bonding to form the required integral frame 12.

Figure 6:
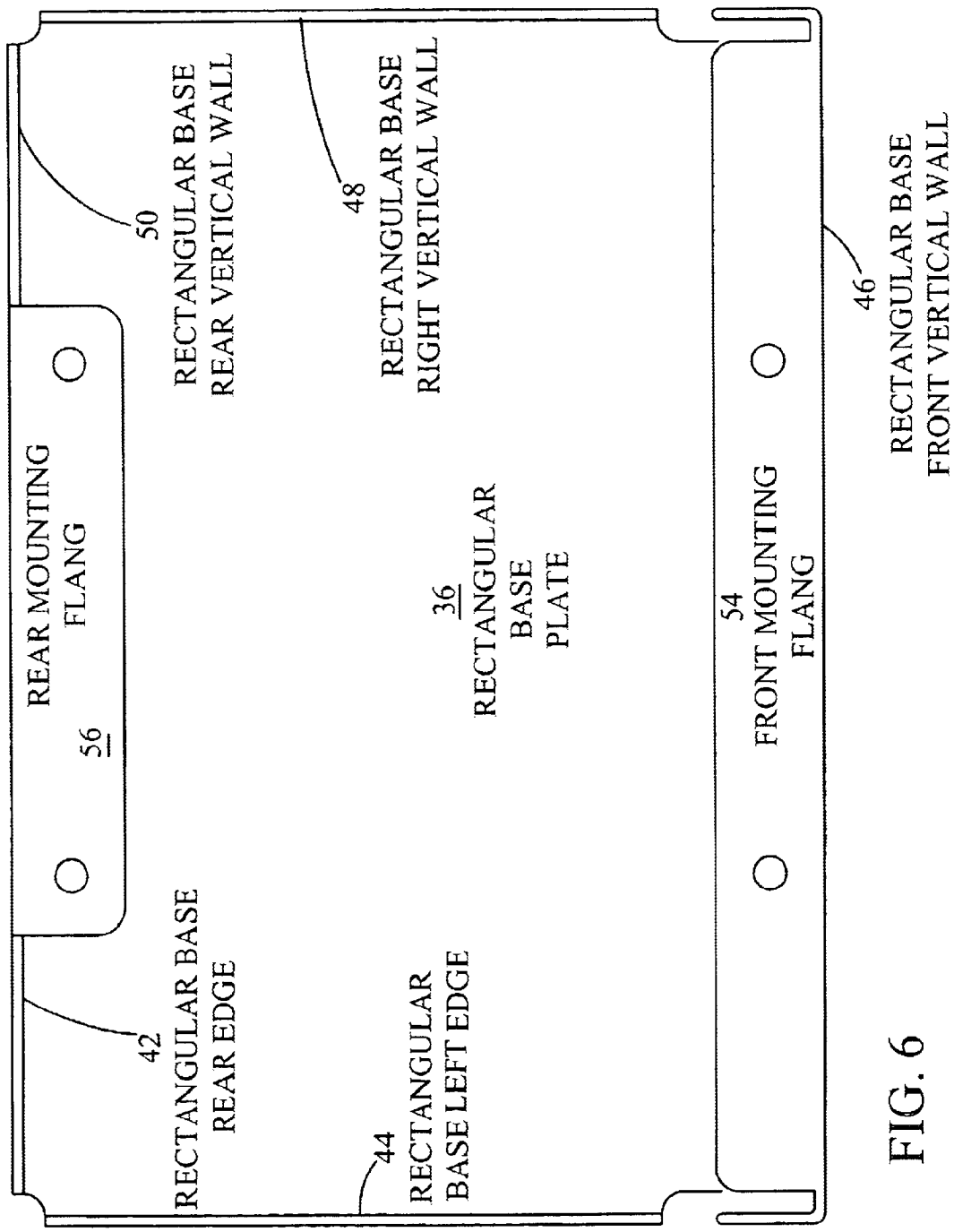
FIG. 6 is a top view of the rectangular base.

FIGS. 1, 2, 5 and FIG. 6 show a rectangular base 34. FIG. 6 shows the rectangular base 34 as a stand alone component having a rectangular base plate 36, a rectangular base plate front edge 38, a rectangular base plate right edge 40, a rectangular base plate rear edge 42 and a rectangular base plate left edge 44. As shown in FIGS. 1, 2, 3 and 6, each respective edge having an extended region of material demarcated for formation into a rectangular base front vertical wall 46, a rectangular base right vertical wall 48, a rectangular base rear vertical wall 50, and a rectangular base left vertical wall 52. Each of the respective rectangular base walls have an inner and outer surface.

Figure 10A:
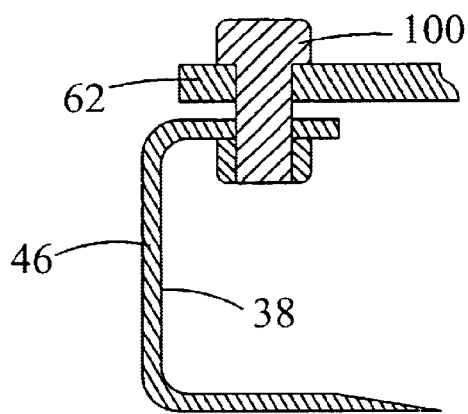
FIGS. 10a–10f are sectional views taken on section lines 1A—1A through 1F—1F on FIG. 1.
Figure 10D:
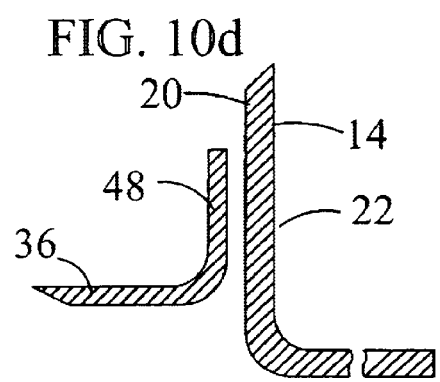

As shown in the sectional view of FIG. 10a, the rectangular base front vertical wall 46 that is formed from an extended region of the rectangular base plate 36 has a first portion of material that is formed or bent upward at a respective first right angle from the plane of the rectangular base plate 36 into a vertical plane to form the rectangular base front vertical wall 46. As shown in sectional FIGS. 10b and 10d, the rectangular base right vertical wall 48 is formed from extended region of material that extends from the rectangular base plate right edge 40 that is formed or bent upward at a first right angle from the plane of the rectangular base plate 36 into a vertical plane to form the rectangular base-right vertical wall 48.

Sectional view 10e shows that the rectangular base integral frame rear vertical wall 50 is formed from an extended region of material extending from the rectangular base plate rear edge 42. The extended region of material is formed or bent upward at a first right angle from the plane of the rectangular base plate 36 into a vertical plane to form the integral frame rear vertical wall 500. The rectangular base left vertical wall is formed from material extending from the rectangular base plate left edge 44 that is formed or bent upward at a first right angle from the plane of the rectangular base plate into a vertical plane to form the left vertical wall.

The sectional view of FIG. 10a shows that the rectangular base front vertical wall has a second portion of the extended material that is used to form the front mounting flange 54.

The second portion is bent inward from the vertical plane of the front vertical wall 46 through a respective second right angle. After the formation step, as shown, the second portion of the additional extended tab region extends in the direction of the integral frame rear vertical wall to form the front mounting flange 54.

FIG. 10*a* shows that after its formation, the front mounting flange is positioned above the rectangular base plate 36 and is separated from the base plate by the height of the front vertical wall 46. The front mounting flange resides on a plane that is parallel to and positioned to be above with the plane of the rectangular base plate. The front mounting flange is therefore in a parallel plane relation or relationship with the rectangular base plate 36.

Figure 10B:
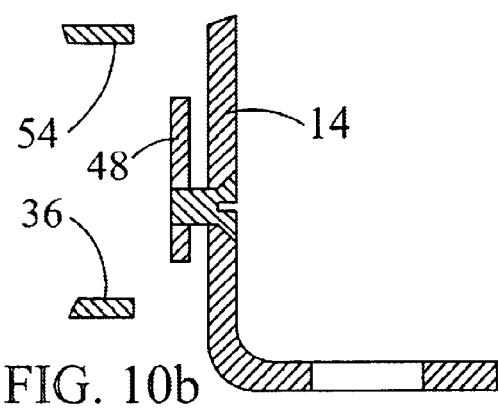

The sectional view of FIG. 10*b* shows that the rectangular base integral frame rear vertical wall 50 has a second portion of the extended material that is used to form the rear mounting flange 56. The second portion is bent inward from the vertical plane of the integral frame rear vertical wall 50 through a respective second right angle. After the formation step, the second portion of the additional extended flange region is extended in the direction of the front vertical wall to form the rear mounting flange 56.

Figure 10E:
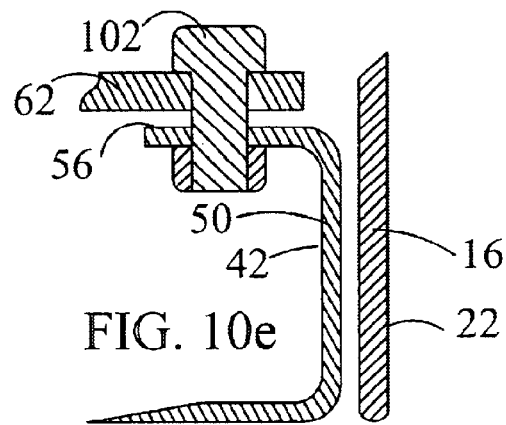
Figure 10C:
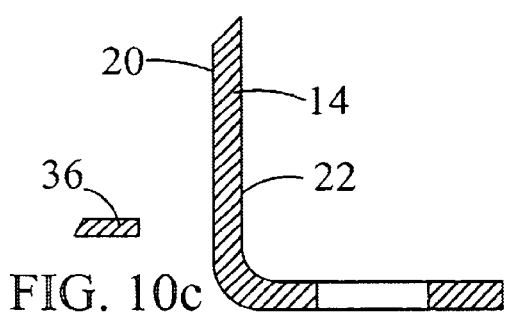
Figure 10F:
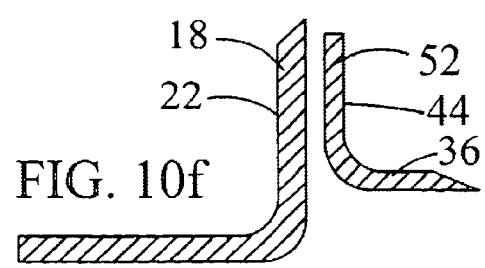

FIG. 10*e* shows that after its formation, the rear mounting flange is above the rectangular base plate 34 and is separated from the rectangular base plate by the height of the rectangular base rear vertical wall 50. The rear mounting flange 56 resides on a plane that is parallel to and above the plane of the rectangular base plate 34. The rear mounting flange is therefore in a parallel plane relation or relationship with the rectangular base plate 34.

FIGS. 1, 2 and 5 show the rectangular base 34 in position between the integral frame right vertical wall 14 inner surface, and the integral frame integral frame left vertical wall 18 inner surface. The rectangular base 34 is orientated and dimensioned to position and couple the outer surface of the rectangular base right vertical wall 48, the outer surface of the rear vertical wall 50 and the outer surface of the left vertical wall 52 into contact with and coupled to the inner surface of the integral frame right vertical wall 14, the inner surface of the integral frame rear vertical wall 16 and the inner surface of the integral frame left vertical wall 18. The various figures show a gap between the outer surface of the rectangular base right vertical wall 48, outer surface of the rear vertical wall 50 and the outer surface of the left vertical wall 52 and the corresponding and opposed inner surface of the integral frame right vertical wall 14, inner surface of the integral frame rear vertical wall 16 and the inner surface of the integral frame left vertical wall 18. However, the gaps where shown, are intended to be illustrative only. In practice, the clearance between surfaces to be coupled is as small as practical taking into consideration the size of the formed parts, the thicknesses of the plate materials used, and the coupling method adopted. FIGS. 1, 2, 3 and 9 show screws being used. The right, rear and left gaps are coupled using two or more screws through each. Bonding the opposing surfaces with structural adhesive is an alternative method of coupling the rectangular base vertical walls to the integral frame vertical walls. Although the figures show the opposing wall surfaces as flat, other surface configurations might be more advantageous such as engaged grooves or channels or roughened surfaces where the use of structural adhesive is contemplated.

The ruggedized inverter structure has a transformer assembly 60 that appears in various views in FIGS. 1, 2, 3, 4*a*, 4*b* and 9. The transformer assembly 60 has a transformer mounting plate 62 that is positioned on and coupled to the front mounting flange 54 and the rear mounting flange 56. The transformer mounting plate 62 used in the 2500 Watt ruggedized inverter chassis is approximately 0.250 inches thick aluminum. The transformer mounting plate 62 is flat and it is dimensioned to extend approximately ⅔ the distance between the integral frame right vertical wall 14 and the integral frame left vertical wall 18. In the example of the 2500 Watt ruggedized inverter chassis, the toroidal transformer 64 has a diameter of approximately 9½ inches and the weight of the transformer assembly is approximately 38 pounds.

Figure 4A:
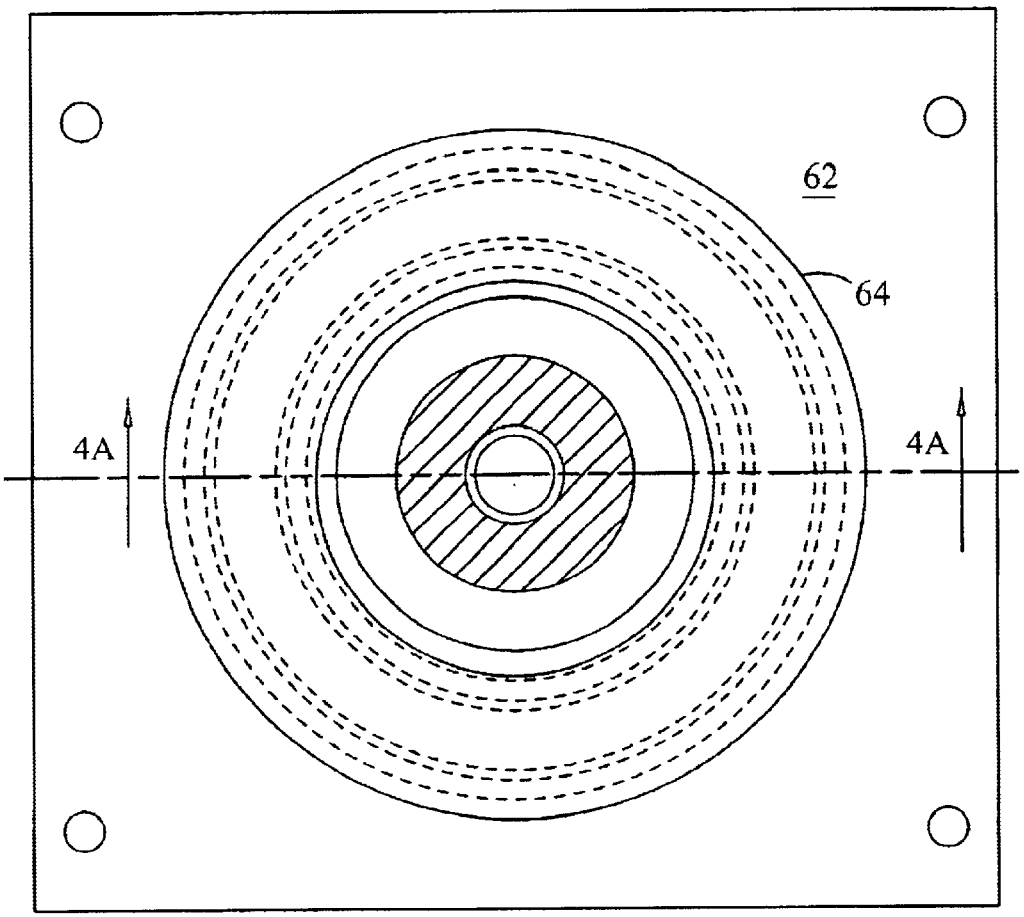
FIG. 4a is a schematic top view of the toroidal transformer and mounting plates assembly.
Figure 4B:
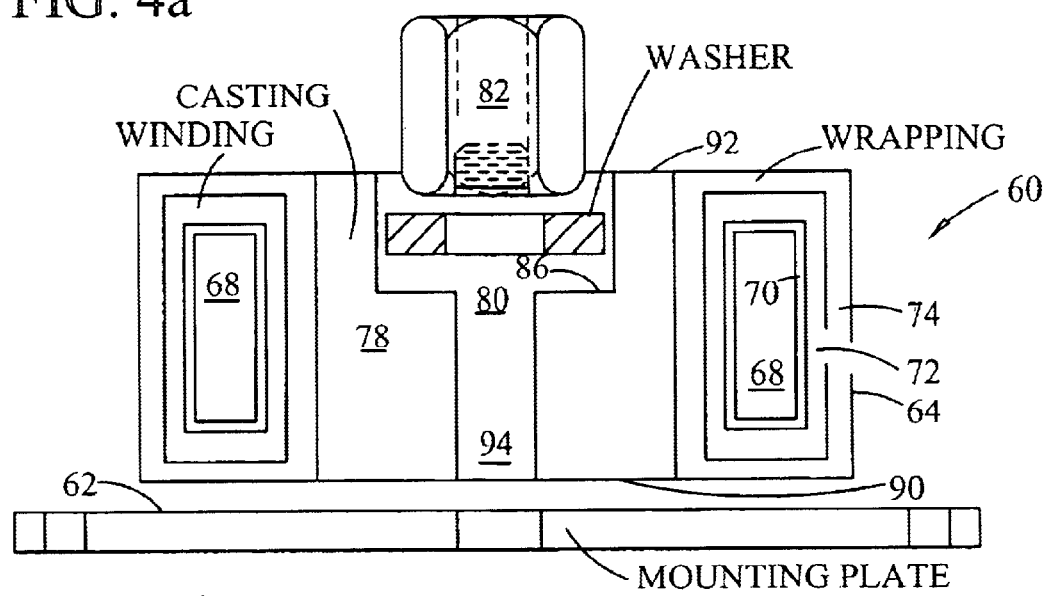

The transformer mounting plate 62 supports and provides a convenient method for mounting the toroidal transformer 64. In addition, the transformer mounting plate 62 provides added stiffness to the ruggedized inverter structure 10 which comprises a combination of the rectangular base 34 and the integral frame 12. The toroidal transformer 64 shown in FIGS. 4*a* and 4*b* has a silicon steel tape wound core 68. FIGS. 4*a* and 4*b* show that the steel tape wound toroid core 68 is first wrapped with a layer of core insulating material 70 to protect the wire insulation on the primary and secondary wire windings 72 from abrasion. The windings are then coated and then wrapped with a layer of winding insulating material 74. The void space that remains after the application of the winding insulating material 74 in the center of the transformer is the center region 76. A mold is formed around the transformer and a casting 78 is then formed by pouring a thermally conductive epoxy resin into the center region 76 and allowing it to harden.

Figure 3:
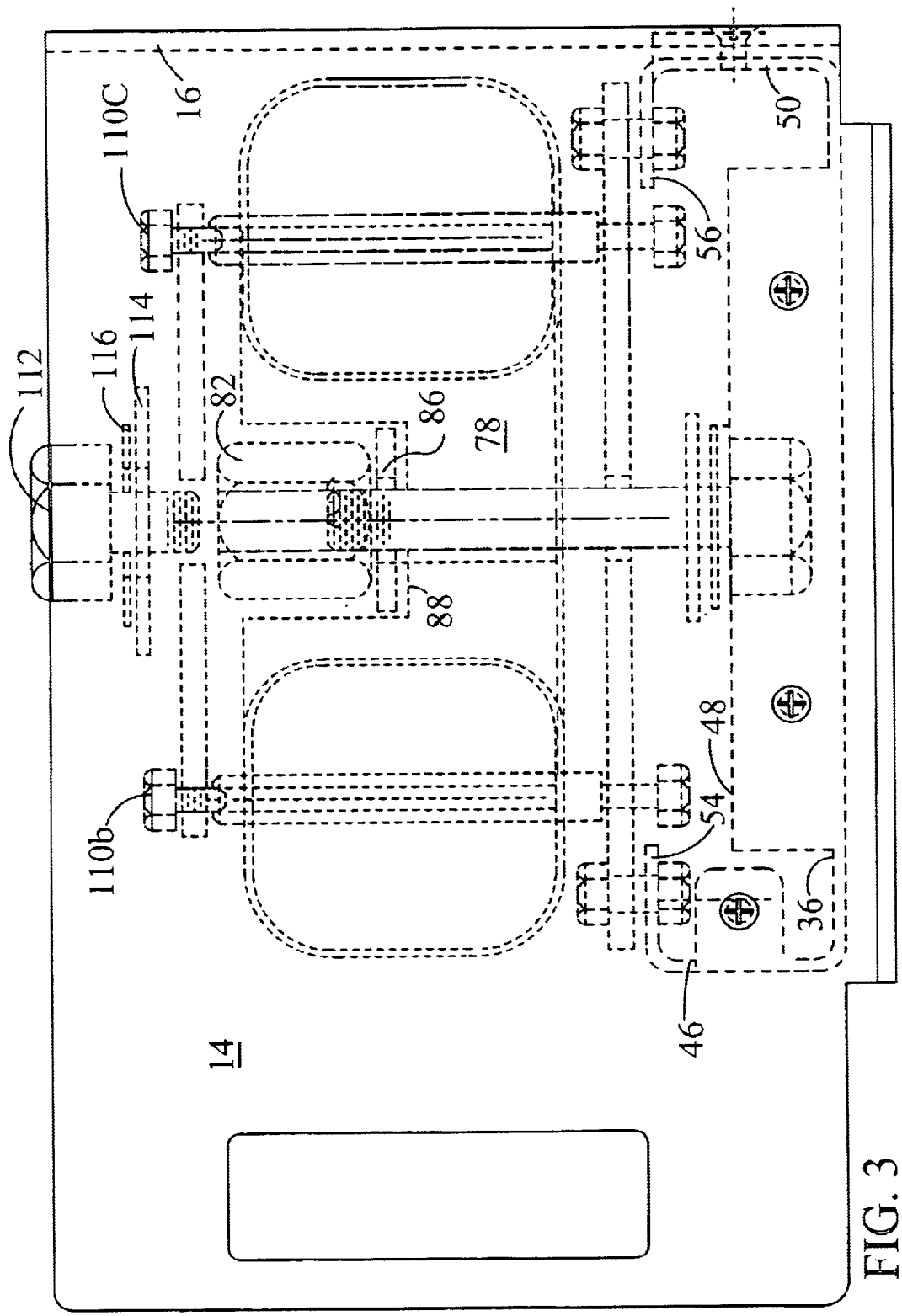
FIG. 3 is a schematic right side view of the inverter assembly showing the integral frame with the toroidal core and mounting plates assembly on the rectangular, base in phantom behind the right wall of the integral frame.
Figure 9:
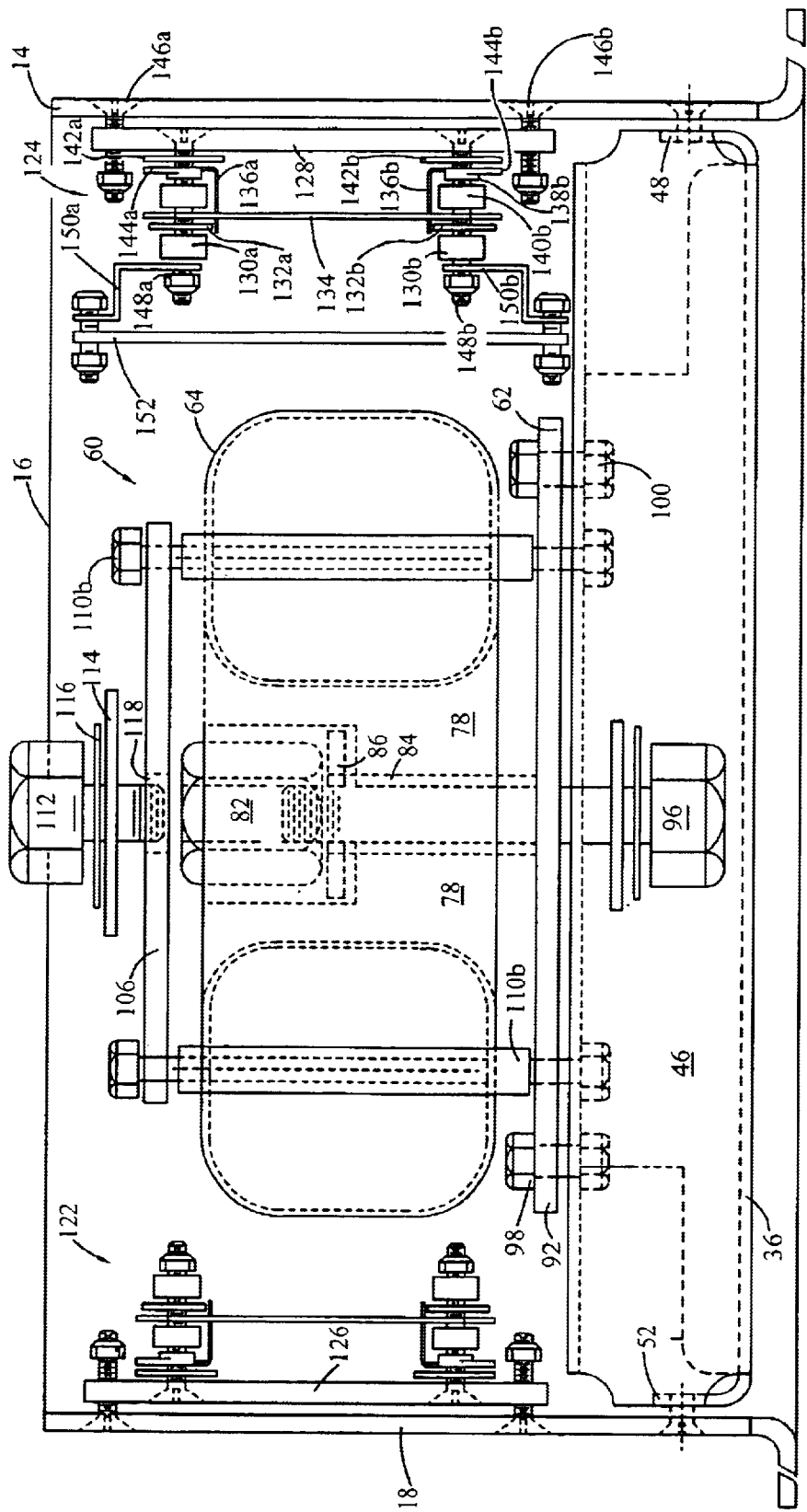
FIG. 9 is a schematic front view of the integral frame and the rectangular base with a front edge view of the left and right power switch module coupled the integral frame left and right vertical walls with the toroidal core and mounting plate assembly being coupled to the rectangular base.

The thermally conductive epoxy resin that is used is typically filled with aluminum powder to enhance its thermal conductivity. FIGS. 2, 3 and 9 show that the casting 78 is formed to include a casting recess 80 that provides a void space for a long nut 82. A bolt clearance hole 84 is formed through the center of the recess and through the center of the casting 78. A washer 86 is placed between the lower end of the long nut 82 and the recess base 88 to protect the surface of the base of the casting recess 80 as the long nut 82 is drawn tight to couple the toroidal transformer 64 to the transformer mounting plate 62. The casting recess 80 and the bolt hole can be drilled after the resin hardens or in the alternative, a cylindrical core or plug could be fashioned for insertion into the center region before the resin is poured. The core or plug would have sufficient draft and would be coated with a releasing agent to permit removal after the resin hardens. In the example structure that was built and tested, the temperature specified for the wire insulation was 200 degrees centigrade. The transformer is therefore a class H design.

The steel tape wound toroidal transformer 64, as shown, has a base surface 90, a top surface 92. A clearance hole 94 is formed in the transformer casting 78. The clearance hole also is formed in the transformer mounting plate 62. The clearance hole 94 receives the transformer mounting bolt 96.

The transformer mounting bolt 96 is of sufficient length and diameter to secure the transformer to the transformer mounting plate 62. The transformer mounting bolt 96 passes upward through the transformer mounting plate 62, then through the bolt clearance hole 84 in the casting 78, through the washer 86 at the recess base 88 to engage the long nut 82 in the casting recess 80. As the long nut is tightened, it draws the bolt into tension coupling the transformer to the transformer mounting plate 62 and compressing the steel tape wound toroidal transformer 62 between the washer 86 and the transformer mounting plate 62. As shown in FIGS. 1, 2, 3 and 9, front mounting plate bolts 98, 100 are used to couple the forward end of the transformer mounting plate to the front mounting flange 54 and rear mounting plate bolts 102, 104 are used to couple the rear end of the transformer mounting plate to the rear mounting flange 56.

Section line 1G—1G on FIG. 1 is taken across the center of the transformer assembly and also across the transformer assembly terminal board 106 on top of the transformer assembly 60. The transformer assembly terminal board 106 is formed from G-10 epoxy fiberglass circuit board plate. The circuit board plate is positioned on the top surface of the toroid and held in position by standoffs 110a, 110b, 110c and 110d. The standoffs shown in FIGS. 2, 3 and 9 comprise a set of corner located or solid standoffs positioned between the transformer assembly terminal board 106 and the transformer mounting plate 62.

FIGS. 2, 3 and 9 show four bolts passing through the transformer assembly terminal board. However, the same figures show, in the alternative, the use of a short bolt 112 and a washer 114, and a top lock washer 116 engaging the top surface of the terminal board and forcing it into compression against the top end of the long nut 82. The short bolt passes through a terminal board clearance hole 118 located in the terminal board on top of the transformer assembly. The washers 114 protect the terminal board. Use of the short bolt 112 makes it possible to eliminate the two rear standoffs 110c and 110d and their respective bolts and nuts. After tightening the long nut 82 on transformer mounting bolt 96 and, if necessary, adjusting the height of the top of the long nut 82 above the transformer mounting plate 62 with washers or shims, the long nut's top end provides a third mounting surface for the base of the terminal board 106. When combined with the front two standoffs 110a, 110b, the top of the long nut provides the third and thus fully determined point of support for the terminal board 106 thereby eliminating the necessity for the two rear standoffs. Heat is removed from the core and the copper wire in the window of the transformer via thermally conductive potting material. The heat is then guided through the transformer mounting plate from which the heat is coupled to the base of the rectangular base plate 36.

The FIG. 1 top view shows a set of three left terminals on the terminal plate 106 that are coupled to the left and right ends of the transformer's primary winding and to the primary winding input center tap terminal. In practice, two output terminals are coupled to the left and right ends of the secondary winding. No center tap is used on the secondary. The secondary voltage is a 120 Vac nominally quasi-square wave or quasi-sine wave in shape. A dead time is established between alternate halves of a full power switching cycle to accommodate the third harmonic reduction and to permit output voltage regulation using duty cycle modulation. The dead time is typically and nominally about three milliseconds. During the dead time, the power switches connected to the left and right side of the primary winding are both off and in the non-conductive state.

During the OFF-TIME, discrete clamp diodes external to the switches or body diodes operating in connection with a pair of separate FET switches provide a clamping function and operate as a shorting circuit that shorts the two ends of the primary winding together to form a temporary common node while the main power switches are off, However, the connection thus formed is not shorted or connected to the primary or input ground node.

Figure 8:
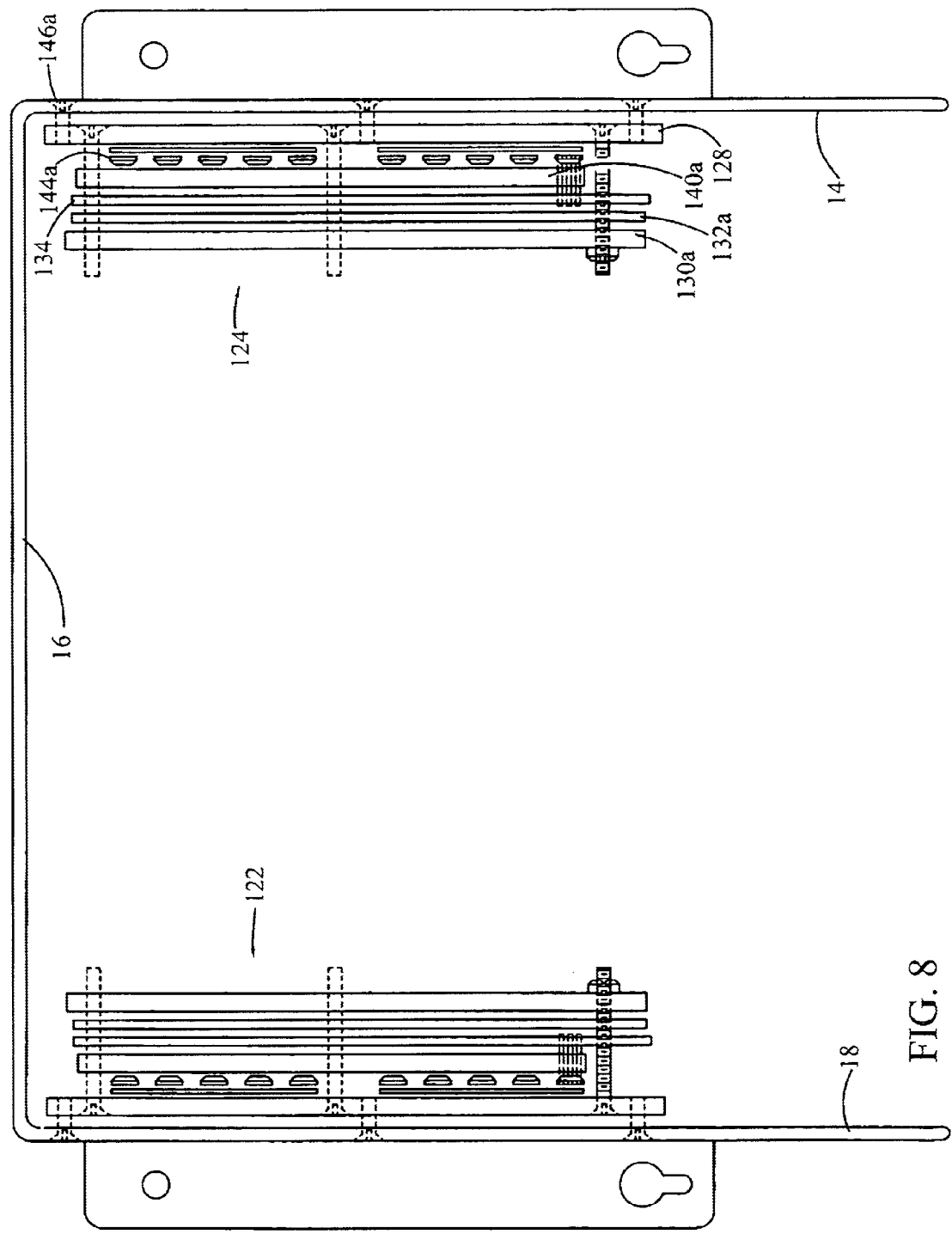
FIG. 8 is a schematic top view of the integral frame with a left and right power switch module coupled thereto, the rectangular base being absent.

FIGS. 8 and 9 show a left power module 122 and right power module 124. FIG. 8 provides a top edge view and FIG. 9 provides front edge view. The left and right power modules are shown coupled to the inner surfaces of the integral frame right vertical wall 14 and integral frame left vertical wall 18. The left power module has a left base plate 126 and the right power module has a right base plate 128. In the 2500 Watt Inverter, each base plate was formed as a large aluminum plate with a thickness of approximately 0.250 inches. Each base plate is coupled to a respective the inner surface of a respective integral frame right and integral frame left vertical wall. Heat passes from the switches on the power modules to the base plate and then to a respective integral frame right and integral frame left vertical walls and then to the rectangular base plate 36 to the vehicle cold plate or rack. However, the two base plates also provide a stiffening function to the integral frame left and right vertical walls which contribute to the ruggedness of the ruggedized inverter chassis.

The right power module 124, as shown in FIG. 8 comprises in sequence, from a top surface on the left to the base plate on the right, a pair of compression bars 130a, 130b, one behind the other, typically formed from ¼ inch aluminum bar stock at least as wide as the length of the metal tab on the semiconductor switch, a pair of circuit board insulator layer 132a, 132b of insulation to electrically isolate the respective compression bar 130a, 130b, a circuit board 134, to which leads 136a, 136b from the semiconductor switches 138a, 138b are connected through feed through holes. A pair of rubber compression bars 140a, 140b each press against the top surfaces of a corresponding row of semiconductor switches. The switches are typically in TO-220 packages. Each semiconductor switch has a metal tab opposite the plastic case. A pair of switch tab insulator layers 142a, 142b isolates each semiconductor switch tab from electrical contact with the inner surface of the ¼ inch thick base plate. The switch tab insulator layers 142a, 142b are positioned in strips under one or more of the metal switch tabs in each of the two rows of switches. In the example tested, each power module used 20 FET switches. The switches were positioned in two rows. All metal switch tabs 144a, 144b . . . are insulated from the corresponding base plate using the switch tab insulator layer material.

Two mounting screws 146a, 146b are shown coupling the external surface of the base plate to the inner surface of the integral frame right vertical wall 14. Three compression bolts 148a, 148b, 148c are shown passing through the base plate, the circuit board, the circuit board insulator layer and then through the compression bar. The three compression bolts draw the compression bar towards the base plate. As the slack is removed, the rubber compression bars are driven against the plastic cases of the TO-220 switch packages forcing the semiconductor metal switch tabs against the switch tab insulator between the metal switch tabs and the base plate. The rubber compression bar is a strip of high durometer neoprene rubber material made by 3M Company. The part number of the material is SJ6008. The rubber compression bar is inserted between a plane formed by the plastic bodies of the FETs and a surface of the circuit board. A high durometer rating implies that the material compresses only slightly under load, but the deformation is sufficient to insure that each of the many semiconductors are in compression.

In the example of the 2500 Watt inverter, each circuit board has two rows often each IRF540; 100 V, 28A power MOSFETs coupled in two parallel sets. The first set is comprised of 16 of the 20 MOSFETs and the second set is comprised of the remaining 4 out of the 20 MOSFETs. The set of 16 MOSFETs are used for the power switching, while the set of 4 MOSFETs are used for transformer off time shorting function.

In general, each FET switch has a metal mounting flange and a plastic body coupled to the metal mounting flange. Each FET has a Gate, a Drain and a Source lead extending from its respective plastic body. The leads are formed and guided by a jig into receiving through holes in the circuit board. The drain lead of each FET is electrically common with its respective metal mounting flange which provides the reason for the switch tab insulator layer.

The metal mounting flange of each FET switch is pressed against a strip of insulating material that is coupled to the base plate. The insulating material is called ISOSTRATE, and is made by Power Devices Corporation, located in Laguna Hills, Calif. It is a type of pre-greased Kapton. The strip of insulating material prevents electrical contact between the drain and the aluminum base plate. The three leads of each FET are formed for insertion into-printed circuitry on the outer surface of the respective circuit board using a bending jig for uniformity.

The mounting screws are inserted through the power FET circuit board inner surface to its outer surface and then to the respective large aluminum base plate to force the power FET circuit board toward the respective large aluminum base plate, the neoprene strip being compressed between the power FET circuit board outer surface and the plastic bodies of the FETs, the plastic bodies transferring the load imposed by the neoprene strip to the metal switch tabs thereby mechanically pre-loading the metal switch tabs against the insulation strip on the large aluminum base plate. The three screws shown in each row are examples only and the number of compression screws to be used is a design choice. The compression screws force the compression bar against the circuit board. The circuit board then forces the rubber compression bars 140a, 140b against the plastic bodies of the row of ten FETs thereby obtaining fairly even pressure on each FET switch.

FIG. 9 shows a first and second "Z" shaped bracket 150a, 150b coupled to the compression bar. The brackets support a control module 152 above the inner surface of one of the right power modules 122. The control module 152 contains the circuitry for the clock, regulation and protection circuits and for all miscellaneous housekeeping functions as well as the drive signals for the control circuitry for the management of the two power modules 122, 124.

Power cables pass (not shown) through the rear wall of the vertical U-Shaped frame to deliver input and output power to the 2500 watt ruggedized inverter. Initial interface connections are formed on the transformer terminal board assembly 106.

While certain specific relationships, materials and other parameters have been detailed in the above description of preferred embodiments, those can be varied, where suitable, with similar results. Other applications, and variation of the present invention will occur to those skilled in the art upon reading the present disclosure. Those variations are also intended to be included within the scope of this invention as defined in the appended claims.

I claim:

1. A ruggedized inverter structure comprising:
   an integral frame, the integral frame having
      an integral frame right vertical wall,
      an integral frame rear vertical wall and
      a left vertical wall,
      a rectangular base having a rectangular base plate, the rectangular base plate having a front side, a rear side, a right side and a left side, the rectangular base plate front side having a front mounting flange, the rectangular base plate rear side having a rear mounting flange, the rectangular base plate right side having a right vertical wall and the rectangular base plate left side having a left vertical wall, the front and rear mounting flanges and the fight and left vertical wails being integral to the rectangular base plate, each having an external and internal surface,
   the rectangular base right and left vertical wall external surfaces being coupled to the integral frame's right vertical wall and integral frame left vertical wall's internal surfaces,
   a transformer assembly having a transformer, and transformer mounting means for rigidly coupling the transformer to the front and rear mounting flange.

2. The ruggedized inverter structure of claim 1 wherein the integral frame right, rear and integral frame left vertical walls are formed from a single homogenous metal sheet.

3. The ruggedized inverter structure of claim 1 wherein the rectangular base plate front and rear mounting flanges and right and left vertical walls are formed from a single homogenous metal sheet.

4. The ruggedized inverter structure of claim 1 wherein the integral frame right, rear and integral frame left vertical walls are formed from a first single homogenous metal sheet and the rectangular base plate front and rear mounting flanges and right and left vertical walls are formed from a second single homogenous metal sheet.

5. The ruggedized inverter structure of claim 1 wherein the means for rigidly coupling the transformer to the front and rear mounting flanges further comprises:
   a transformer mounting plate, the mounting plate having a front end coupled to the rectangular base having a rectangular base plate, the rectangular base plate having a front end and a rear end, the front end being coupled to the front mounting flange, the rear, end being coupled to the rear mounting flange,
   a bolt passing through the center of the transformer and through the center of the transformer mounting plate to couple the transformer to the mounting plate.

6. The ruggedized inverter structure of claim 5, wherein the transformer further comprises a resin filled center region, the resin being loaded with a filler having an improved thermal conductivity, a recess and a bolt clearance hole co-axial to the recess are formed in the resin filled center region for receiving a bolt passing through the bolt clearance hole and through the transformer mounting plate to couple the transformer to the transformer assembly.

7. The ruggedized inverter structure of claim 1 further comprising:
   a right and left power module, each respective power module having a base plate, the right power module base plate being coupled to the integral frame right vertical wall and the left power module base plate being coupled to the integral frame left vertical wall, each respective base plate operating to stiffen the corresponding integral frame vertical wall.

8. The ruggedized inverter structure of claim 7 wherein each power module further comprises:
   a compression bar,
   a printed circuit board having a first and second surface and at least a first row of semiconductor switches mounted in the printed circuit board, each switch having a plastic case surface and a metal switch tab surface each plastic case surface being positioned to be in a plastic case plane, the plastic case plane being parallel to and spaced apart from the printed circuit board first surface, a printed circuit board insulator layer between the compression bar and the printed circuit board second surface, a rubber compression bar between the printed circuit board first surface and the plastic case plane, a semiconductor metal switch tab insulator layer positioned between the semiconductor metal switch tab surfaces and the base plate, a plurality of bolts being passed through the base plate and through the compression bar and tightened, the bolts drawing the compression bar against the circuit board insulator layer, the circuit board insulator layer against the circuit board, the circuit board against the rubber compression bar, the rubber compression bar against the plastic case plane, the switch tabs against the switch tab insulator layer and the switch tab insulator layer against the base plate, all into compression, means for coupling the base plate to a corresponding integral frame vertical wall.

9. A ruggedized inverter structure comprising:

an integral and homogenous frame, the integral and homogenous frame having
  an integral frame right vertical wall,
  an integral frame rear vertical wall and
  an integral frame left vertical wall, an rectangular base formed from a single plate to provide a front mounting flange and a rear mounting flange in parallel plane relation above the plane of an integral and homogenous rectangular base plate, and at least a right vertical wall and left vertical wall extending vertically at right angles from opposite sides of the base plate, each vertical wall surface having an outer and inner surface, the rectangular base plate being positioned between the inner surface of the integral frame right vertical wall, and the integral frame left vertical wall, the rectangular base plate being orientated and dimensioned to position and couple the rectangular base right vertical wall outer surface, integral frame rear vertical wall outer surface and integral frame left vertical wall outer surface to corresponding and opposed inner surfaces of the integral frame right vertical wall, integral frame rear vertical wall and integral frame left vertical wall, a transformer assembly having a transformer coupled to a transformer mounting plate, the transformer mounting plate having a front end and a rear end, the transformer mounting plate front end being coupled to the front mounting flange, the transformer mounting plate rear end being coupled to the rear mounting flange.

10. The ruggedized inverter structure of claim 9 wherein the integral frame right, rear and integral frame left vertical walls are formed from a single homogenous metal sheet.

11. The ruggedized inverter structure of claim 9 wherein the rectangular base plate front and rear mounting flanges and right and left vertical walls are formed from a single homogenous metal sheet.

12. The ruggedized inverter structure of claim 9 wherein the integral frame right, rear and integral frame left vertical walls are formed from a first single homogenous metal sheet and the rectangular base plate front and rear mounting flanges and right and left vertical walls are formed from a second single homogenous metal sheet.

13. The ruggedized inverter structure of claim 9 wherein the means for rigidly coupling the transformer to the front and rear mounting flanges further comprises:

a transformer mounting plate, the mounting plate having a front end coupled to the rectangular base having a rectangular base plate, the rectangular base plate having a front end and a rear end, the front end being coupled to the front mounting flange, the rear end being coupled to the rear mounting flange, a bolt passing through the center of the transformer and through the center of the transformer mounting plate to couple the transformer to the mounting plate.

14. The ruggedized inverter structure of claim 13, wherein the transformer further comprises a resin filled center region, the resin being loaded with a filler having an improved thermal conductivity, a clearance hole being formed in the resin filled center region, the hole being formed to have a recess.

15. The ruggedized inverter structure of claim 9 further comprising:

a right and left power module, each respective power module having a base plate, the right power module base plate being coupled to the integral frame right vertical wall and the left power module base plate being coupled to the integral frame left vertical wall, each respective base plate operating to stiffen the corresponding integral frame vertical wall.

16. The ruggedized inverter structure of claim 15 wherein each power module further comprises:

a compression bar, a printed circuit board having a first and second surface and at least a first row of semiconductor switches mounted in the printed circuit board, each switch having a plastic case surface and a metal switch tab surface, each plastic case surface being positioned to be in a plastic case plane, the plastic case plane being parallel to and spaced apart from the printed circuit board first surface, a printed circuit board insulator layer between the compression bar and the printed circuit board second surface, a rubber compression bar between the printed circuit board first surface and the plastic case plane, a semiconductor switch tab insulator layer positioned between the semiconductor metal switch tab surfaces and the base plate, a plurality of bolts being passed through the base plate and through the compression bar and tightened, the bolts drawing the compression bar against the circuit board insulator layer, the circuit board insulator layer against the circuit board, the circuit board against the rubber compression bar, the rubber compression bar against the plastic case plane, the switch tabs against the switch tab insulator layer and the switch tab insulator layer against the base plate, all into compression, means for coupling the base plate to a corresponding integral frame vertical wall.

17. A ruggedized inverter structure comprising:

an integral frame, the integral frame having
  an integral frame right vertical wall,
  an integral frame rear vertical wall and
  an integral frame integral frame left vertical wall,
  the integral frame rear vertical wall having a right end coupled at a right angle to the distal end of the integral frame right vertical wall, and
  the integral frame rear vertical wall having a left end coupled at a right angle to the distal end of the integral frame left vertical wall, the coupled walls each having a respective inner surface and outer surface, the integral frame right vertical wall and integral frame left vertical walls being in parallel relation to form a channel terminated by the integral frame rear vertical wall, a rectangular base having, a rectangular base plate having a front edge, a right edge, a rear edge and a left edge, each respective edge having an extended region of material demarcated for formation into, a front vertical wall, a right vertical wall, an integral frame rear vertical wall, and an integral frame left vertical wall, the rectangular base plate front edge extended region of material has a first portion that is formed or bent upward at a first right angle from the plane of the rectangular base plate to form the front vertical wall and a second portion demarcated for formation into a front mounting flange, the rectangular base plate right edge extended region of material being formed or bent upward at a first right angle from, the plane of the rectangular base plate to form the right vertical wall, the rectangular base plate rear edge extended region of material has a first portion that is formed or bent upward at a first right angle from the plane of the rectangular base plate to form the integral frame rear vertical wall and a second portion demarcated for formation into a front mounting flange.

the rectangular base plate left edge extended region of material being formed or bent upward at a first right angle from the plane of the rectangular base plate to form the integral frame left vertical wall, the rectangular base plate front edge extended region of material second portion being bent inward from the plane of the front vertical wall through a second right angle to form a front mounting flange extending toward the integral frame rear vertical wall in parallel plane relation with the base plate, the front mounting flange being separated from and above the base plate by the front vertical wall, the rectangular base plate rear edge extended region of material second portion being bent inward from the plane of the integral frame rear vertical wall through a second right angle to form a rear mounting flange extending toward the front vertical wall in parallel plane relation with the base plate, the rear mounting flange being separated from and above the base plate by the integral frame rear vertical wall, the rectangular base plate being positioned between the integral frame right vertical wall, and the integral frame left vertical wall, the rectangular base plate being orientated and dimensioned to position and couple the rectangular base right vertical wall outer surface, integral frame rear vertical wall outer surface and integral frame left vertical wall outer surface to corresponding and opposed inner surfaces of the integral frame right vertical wall, integral frame rear vertical wall and integral frame left vertical wall, a transformer assembly having a transformer coupled to a transformer mounting plate, the transformer mounting plate having a front end and a rear end, the transformer mounting plate front end being coupled to the front mounting flange, the transformer mounting plate rear end being coupled to the rear mounting flange.

* * * * *